United States Patent
Farnworth et al.

(10) Patent No.: US 7,081,385 B2
(45) Date of Patent: Jul. 25, 2006

(54) NANOTUBE SEMICONDUCTOR DEVICES AND METHODS FOR MAKING THE SAME

(75) Inventors: Warren M. Farnworth, Nampa, ID (US); Kevin G. Duesman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 257 days.

(21) Appl. No.: 10/822,113

(22) Filed: Apr. 8, 2004

(65) Prior Publication Data

US 2004/0188738 A1    Sep. 30, 2004

Related U.S. Application Data

(60) Division of application No. 10/315,511, filed on Dec. 9, 2002, now Pat. No. 6,858,891, which is a continuation of application No. 10/092,829, filed on Mar. 6, 2002, now Pat. No. 6,515,325.

(51) Int. Cl.
*H01L 27/108* (2006.01)
*H01L 29/76* (2006.01)
*H01L 29/94* (2006.01)
*H01L 21/8242* (2006.01)

(52) U.S. Cl. ............ 438/253; 438/254; 438/391; 438/392; 438/393; 438/394; 438/395; 438/396; 438/397; 438/398; 438/399; 257/296; 257/306; 257/309; 977/1

(58) Field of Classification Search ............ 438/253, 438/254, 391–99; 257/296, 306, 309, 530–535
See application file for complete search history.

(56) References Cited

U.S. PATENT DOCUMENTS

| 5,032,892 A | 7/1991 | Chern et al. |
|---|---|---|
| 5,512,767 A | 4/1996 | Noble, Jr. |
| 5,561,310 A | 10/1996 | Woo et al. |
| 5,693,977 A | 12/1997 | Haddon et al. |
| 5,753,949 A | 5/1998 | Honma et al. |
| 5,796,573 A | 8/1998 | Kotecki et al. |
| 5,859,451 A | 1/1999 | Narita |
| 5,903,010 A | 5/1999 | Flory et al. |
| 5,909,618 A | 6/1999 | Forbes et al. |
| 5,916,642 A | 6/1999 | Chang |
| 6,031,711 A | 2/2000 | Tennent et al. |
| 6,146,227 A | 11/2000 | Mancevski |
| 6,147,605 A | 11/2000 | Vega et al. |
| 6,157,043 A | 12/2000 | Miyamoto |
| 6,165,839 A | 12/2000 | Lee et al. |

(Continued)

FOREIGN PATENT DOCUMENTS

DE    10032370    12/2001

(Continued)

OTHER PUBLICATIONS

Shea, H.R. et al., "Manipulation of Carbon Nanotubes and Properties of NanoField_Effect Transistors and Rings," *Microelectronic Engineering* 46, pp. 101-104 (1999).

(Continued)

*Primary Examiner*—Long Pham
*Assistant Examiner*—Shrinivas H. Rao
(74) *Attorney, Agent, or Firm*—Klarquist Sparkman LLP

(57) ABSTRACT

Provided herein are vertical nanotube semiconductor devices and methods for making the same. An embodiment of the semiconductor devices comprises a vertical transistor/capacitor cell including a nanotube. The device includes a vertical transistor and a capacitor cell both using a single nanotube to form the individual devices.

27 Claims, 3 Drawing Sheets

U.S. PATENT DOCUMENTS

| | | |
|---|---|---|
| 6,168,987 B1 | 1/2001 | Jeng et al. |
| 6,183,714 B1 | 2/2001 | Smalley et al. |
| 6,203,864 B1 | 3/2001 | Zhang et al. |
| 6,229,171 B1 | 5/2001 | Chun et al. |
| 6,243,583 B1 | 6/2001 | Tsutsui et al. |
| 6,250,984 B1 | 6/2001 | Jin et al. |
| 6,294,798 B1 | 9/2001 | Zambrano |
| 6,297,063 B1 | 10/2001 | Brown et al. |
| 6,313,495 B1 | 11/2001 | Shen et al. |
| 6,323,512 B1 | 11/2001 | Noh et al. |
| 6,325,907 B1 | 12/2001 | Andelman |
| 6,348,700 B1 | 2/2002 | Ellenbogen et al. |
| 6,361,861 B1 | 3/2002 | Gao et al. |
| 6,388,185 B1 | 5/2002 | Fleurial et al. |
| 6,414,836 B1 | 7/2002 | Tennent et al. |
| 6,423,583 B1 | 7/2002 | Avouris et al. |
| 6,424,517 B1 | 7/2002 | Ikeda et al. |
| 6,437,381 B1 | 8/2002 | Gruening et al. |
| 6,515,325 B1 | 2/2003 | Farnworth et al. |
| 2001/0023986 A1 | 9/2001 | Mancevski |
| 2002/0001905 A1 | 1/2002 | Choi et al. |
| 2002/0020841 A1 | 2/2002 | Ihm |
| 2002/0024099 A1 | 2/2002 | Watanabe et al. |

FOREIGN PATENT DOCUMENTS

| | | |
|---|---|---|
| JP | 405343615 | 12/1993 |
| JP | 407147409 | 6/1995 |
| JP | 2000-124079 | 4/2000 |
| JP | 2000-256007 | 9/2000 |
| JP | 2002-110977 | 4/2002 |
| WO | WO00/73204 | 12/2000 |
| WO | WO01/30689 | 5/2001 |
| WO | WO01/66217 | 9/2001 |

OTHER PUBLICATIONS

Ma, R.Z. et al., "Study of electrochemical capacitors utilizing carbon nanotube electrodes," *Journal of Power Sources* 84, pp. 126-129 (1999).

Diederich, L. et al., "Supercapacitors based on nanostructured carbon electrodes grown by Cluster-beam deposition," *Applied Physics Letters*, vol. 75, No. 17, pp. 2662-2664 (Oct. 25, 1999).

Ong, Keat Ghee et al., "A Wireless, Passive Carbon Nanobute-Based Gas Sensor," *IEEE Sensors Journal*, vol. 2, No. 2, pp. 82-88 (Apr. 2002).

Marrian, Christie R.K., "Fabricating the Next Generation of Electronics from Molecular Structures," *The AMPTIAC News Letter*, vol. 6, No. 1, pp. 57-61 (Spring 2002).

Martel, R. et al., "Carbon nanotube Field-Effect transistors and logic devices," $222^{nd}$ *ACS National Meeting*, (Aug. 26-30, 2001) (Abstract only).

Jing, Guo et al., "Performance projections for ballistic carbon nanotube field-effect transistors," *Applied Physics Letters*, vol. 80, No. 17, pp. 3192-3194 (2002) (Abstract only).

Jacoby, M., "Nanotube Conduction: Understanding, Control of Electrical Properties Bring Uses Closer to Reality," *Chemical & Engineering News*, p. 13 (Apr. 30, 2001).

Rouhi, A.M., "From Membranes to Nanotubules: Template-Synthesized Nanotubule Membranes are Enabling New Approaches to Separations and Analytical Sensing," *Chemical & Engineering News*, pp. 29-33 (Jun. 11, 2001).

Kasumov, A.Y. et al., "Supercurrents Through Single-Walled Carbon Nanotubes," *Science*, vol. 284, pp. 1508-1510 (May 28, 1999).

Kong, J. et al., "Synthesis of Individual Single-Walled Carbon Nanotubes on Patterned Silicon Wafers," *Nature*, vol. 395, pp. 878-881 (Oct. 29, 1998).

Lerner, E.J., "Putting Nanotubes to Work," *The Industrial Physicist*, pp. 22-25 (Dec. 1999).

"Ion Beam Technology for Production of Silicon Nanowire Arrays".

"General Overview of Quantum Wire Research," The Technology Development Company (Feb. 2000).

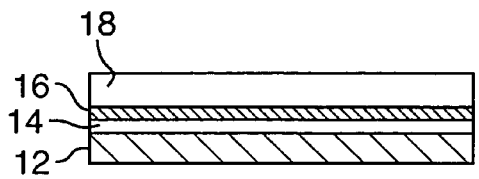
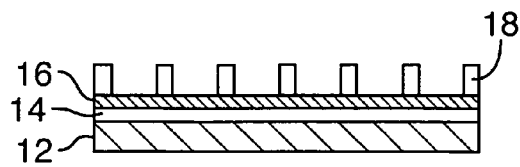
FIG. 2A    FIG. 2B
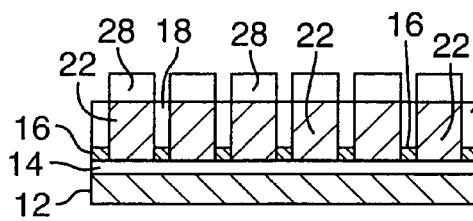
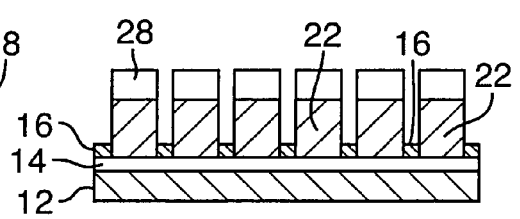
FIG. 2C    FIG. 2D
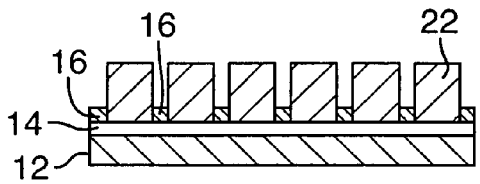
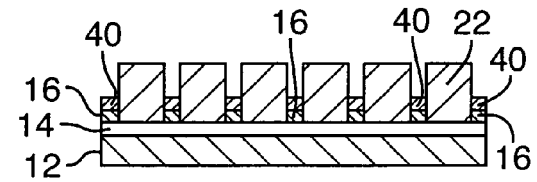
FIG. 2E    FIG. 2F
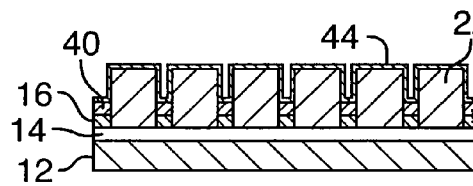
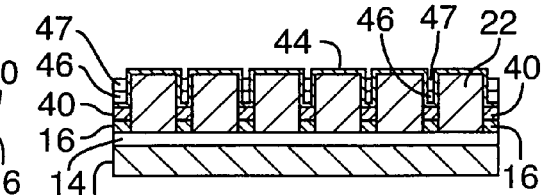
FIG. 2G    FIG. 2H
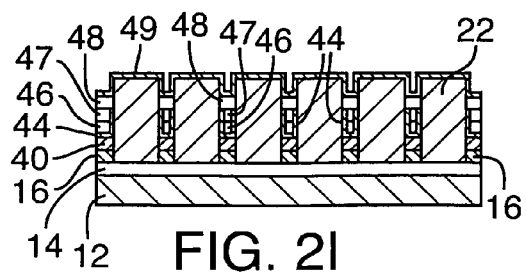
FIG. 2I

US 7,081,385 B2

NANOTUBE SEMICONDUCTOR DEVICES AND METHODS FOR MAKING THE SAME

PRIORITY CLAIM

This application is a divisional of pending U.S. patent application Ser. No. 10/315,511, filed Dec. 9, 2002, now U.S. Pat. No. 6,858,891 which is a continuation of U.S. patent application Ser. No. 10/092,829, filed Mar. 6, 2002, now issued as U.S. Pat. No. 6,515,325, both of which are incorporated herein by reference.

FIELD OF THE INVENTION

The present invention relates to semiconductor devices including carbon nanotubes, such as a vertical nanotube transistor/capacitor cell.

BACKGROUND OF THE INVENTION

There are continuing goals in semiconductor fabrication to reduce the number of masks or steps needed to fabricate semiconductor devices, e.g., memory cell devices such as DRAMs. Likewise, there is a continuing goal to shrink the size of such devices thereby maximizing the density of the resulting chip or die. Lastly, there is a desire to provide such devices that perform consistently.

There has been some recent interest in the use of carbon nanotubes due to their remarkable properties. Researchers have found carbon nanotubes to be stronger and tougher than steel, capable of carrying higher currents than either copper or superconductors, and able to form transistors a few nanometers across. In addition, nanotubes have high thermal conductivity and are stable at high temperatures. E. Lerner, "Putting Nanotubes to Work," *The Industrial Physicist*, pp. 22–25 (Dec. 1999). Further, carbon nanotubes may have a consistent resistance (predicted to be about 6.0 kilohms) regardless of the length of the tube due to the intrinsic characteristics of ballistic transport in such nanotubes. A. Kasumov, "Supercurrents Through Single-Walled Carbon Nanotubes," *Science*, 284, 1508–1510 (May 1999). Currently, the resistance of conventional semiconductor devices varies due to the doping means that are used to produce the desired resistance. Thus, the consistent resistance of a nanotube would be of particular value for semiconductor devices. However, neither the form that particular nanotube semiconductor devices would take nor methods for mass production of nanotube semiconductor devices are currently known or available.

SUMMARY OF THE INVENTION

The present invention provides vertical nanotube semiconductor devices and methods for making the same. An embodiment of the semiconductor devices of the present invention comprises a vertical transistor/capacitor cell including a nanotube (a hollow tube). The device includes a vertical transistor and a capacitor cell both using a single nanotube to form the individual devices.

The present invention also provides a semiconductor device comprising vias for electrical interconnections between layers of integrated circuits. Specifically, an embodiment of a via according to the present invention may comprise a first trace layer, a nanotube (e.g., a carbon tube) having a lower end connected to the first trace layer, the nanotube being substantially orthogonal to the first trace layer. A second trace layer is electrically connected to an upper end of the nanotube. Thus, the nanotube forms a via or electrical interconnection between the first and second trace layers.

The present invention also provides a semiconductor device comprising a logic stack or multi-gate stack device including a stack of transistors formed about a vertical nanotube. The multi-gate stack may include two transistors in series, such as for an AND gate. The small size and predictable resistivity of the nanotubes used in this device provide unique advantages.

The present invention further provides methods for forming semiconductor devices having multiple vertical nanotubes using patterned nucleation materials formed upon semiconductor substrates.

All of the specifically described methods and semiconductor devices are set forth for illustration of the methods and devices of the present invention. It is understood, however, that the present invention is not limited to those specifically described embodiments of the methods and devices.

BRIEF DESCRIPTION OF THE DRAWINGS

FIGS. 2A–2I depict process steps for fabrication of an embodiment of a vertical transistor/capacitor cell array.

DETAILED DESCRIPTION OF THE INVENTION

Figure 1:
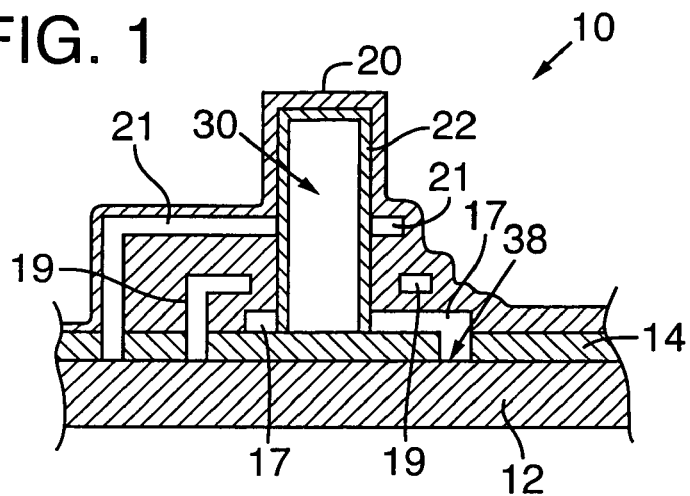
FIG. 1 is an embodiment of a vertical transistor/capacitor cell formed with a nanotube.

Certain embodiments of the invention are illustrated in the figures, like numerals being used to refer to like and corresponding parts of the devices and methods depicted in the various drawings.

The present invention provides semiconductor devices, such as vertical transistor/capacitor cell devices, vias or interconnects, and vertical stacks of logic gates, wherein the devices include a nanotube, for example a carbon nanotube. Also provided are methods for fabrication of carbon nanotube semiconductor devices. The present invention need not be limited to the particular semiconductor devices illustrated in the figures nor the particular embodiments of the same. Other semiconductor devices or embodiments of the semiconductor devices illustrated in the drawings may be formed using the methods of the present invention. For example, the devices and methods provided herein may include individual carbon nanotubes or collections of carbon nanotubes.

With the description as provided below, it is readily apparent to one skilled in the art that various processes described herein may be utilized in various configurations. For example, the present invention may be used in the formation of transistors, capacitors, interconnections, etc. for semiconductor devices, particularly various memory devices. Exemplary vertical transistor/capacitor cells for DRAM structures and methods for making the same are described below. The same is true as to exemplary interconnects and logic stacks for use in semiconductor circuitry such as memory cells. It is to be understood that these semiconductor structures and fabrication methods are only a few examples of many possible structures and methods for practice of the present invention. For example, carbon nanotubes are used to form the devices, but nanotubes formed of different materials may be used, such as silicon carbide. As another example, single or stacked capacitors could be formed.

Further, although only DRAMS are mentioned specifically, this invention is applicable to other semiconductor devices and particularly to all areas of memory and memory access technology including logic devices and all RAM and ROM devices (e.g., DRAM, SRAM, SCRAM, EDRAM, VDRAM, NVSRAM, NVDRAM, DPSRAM, PSDRAM).

An embodiment of a vertical transistor/capacitor cell 10 including a nanotube is shown in FIG. 1. The device shown may be used as a vertical transistor and a capacitor cell, both using a single nanotube 22, such as a carbon nanotube, to form the individual devices. More specifically, the vertical transistor/capacitor cell 10 shown in FIG. 1 includes a substrate 12 having the desired circuitry (not shown) necessary to complete a memory cell array (such as an array as shown in FIG. 2I). A first insulation layer 14, comprising any suitable insulation material, e.g., silicon dioxide, covers the substrate 12 with a portion 38 of the substrate remaining exposed. A source 17 is connected at portion 38 to the external circuitry (not shown) formed on the substrate 12. Likewise other portions of the substrate 12 are left exposed for connection of a transistor gate 19 and drain 21 (discussed below) to the external circuitry of substrate 12.

The nanotube 22 is connected substantially orthogonal to an upper surface of the first insulation layer 14. The vertical transistor portion of structure 10 depicted in FIG. 1 includes a source 17 and an annular gate 19 insulated from nanotube 22. Gate 19 is connected to external circuitry (not shown) on the substrate 12. The transistor further includes a channel formed by the nanotube 22, and an annular drain 21 connected to the nanotube 22 and to external circuitry (not shown) on the substrate 12. An isolation layer 20, comprising boron nitride or any other suitable insulating material, covers exposed portions of an exterior wall of nanotube 22. As is known to those skilled in the art, isolation layer 20 may comprise plural layers. The plural layers of insulation 20 may be deposited at different steps in the construction of a device such as the transistor/capacitor cell 10 so as to separate or insulate the source 17, gate 19, drain 21 from one another and from portions of the substrate 12.

As known to those persons skilled in the art, various components of the vertical transistor/capacitor cell structure 10 shown in FIG. 1 may be of a variety of dimensions depending upon the device properties desired. For example, an embodiment of structure 10 may have the following dimensions: the nanotube 22 (preferably a carbon nanotube) may have an internal diameter of from about 0.6 to greater than about 5 nanometers and a length of from about 1 to about 2 microns. The insulation layer 14 may be from about 0.1 to about 1 micron in thickness. The source 17, gate 19, and drain 21 may be from about 0.25 to about 1 micron in thickness, and insulator 20 may range from about 0.002 to about 0.5 micron in thickness.

In particular embodiments, the device 10 depicted in FIG. 1 may be used as a transistor. As with typical transistors, the gate 19 controls current flowing through the nanotube 22 (i.e., the channel) between the source 17 and drain 21.

Similarly, in particular embodiments, the device 10 depicted in FIG. 1 may be used as a capacitor. The source 17 allows the nanotube 22 to receive a potential. Thus, the source 17 may serve to charge the capacitor while nanotube 22 serves as a capacitor cell storing the charge. Charge may be directed to and drained away from the cell (nanotube 22) by control of gate 19. The nanotube 22 acting as the cell allows the capacitor to store charge on interior walls of the nanotube as well as on the exterior walls, there by increasing storage capacity as compared to the typical semiconductor capacitor.

Thus, each nanotube 22 forms both a channel of a vertical transistor and a cell for the capacitor. That is, due to the unique properties of nanotubes, a single nanotube may serve as a dielectric material and form a capacitor cell, and serve as a semiconductor material and form a transistor channel in the same device. Not only does the nanotube device provide superior physical characteristics (e.g., consistent resistance) the nanotubes also allow formation of much smaller semiconductor devices, thereby reducing the overall size of computer dies. Further, due to the consistency in resistance of the nanotubes, unlike conventional devices, the devices of the present invention will be consistent device-to-device, die-to-die, and wafer-to-wafer.

A method for making an array of the vertical transistor/capacitor cell structures 10 shown in FIG. 1 is depicted in FIGS. 2A–2I. All depositions, etches, reflows, etc. are performed by conventional methods (unless otherwise stated) as known to those persons skilled in the art. Likewise, as is understood by those skilled in the art, materials forming components of the described structures are not limited to those explicitly cited but may comprise any suitable material for the function performed by the component.

With reference to FIG. 2A, a substrate 12 is provided. Substrate 12 is formed from any suitable material that may serve to form substrates for semiconductor devices. Useful substrate materials include, but are not limited to, doped or undoped silicon, doped or undoped polycrystalline silicon, gallium arsenide, gallium phosphide, and indium phosphide. The substrate 12 is then treated to form desired circuitry for the final device, to which the vertical transistor/capacitor cell structures 10 (as shown in FIG. 1) will be connected, such as a memory device decoding network.

With reference to FIG. 2A, a first insulation layer 14 is formed over the substrate 12. The first insulation layer 14 may comprise any insulating material capable of functioning as an insulator or a dielectric in a semiconductor device. Exemplary insulating materials to form the first insulation layer 14 include, but are not limited to silicon dioxide, tetraethyl orthosilicate (TEOS), nitrides, and oxides. Alternatively, plural insulating materials may be employed to form insulation layer 14.

A nucleation layer 16 is then applied to cover the first insulation layer 14. The nucleation layer 16 may be formed by a single application or by plural applications of suitable nucleation materials. Nucleation layer 16 may comprise any material capable of nucleating growth of a nanotube. For example, nickel, cobalt and iron are known catalysts for the growth of carbon nanotubes. A particularly useful composition for the nucleation of carbon nanotube growth comprises $Fe(NO_3)_3 \cdot 9H_2O$, $MoO_2(acac)_2$ and alumina nanoparticles.

A patterning layer 18 is then formed over the nucleation layer 16 and is patterned, developed, and etched such that the areas of the nucleation layer 16 upon which nanotubes 32 are to be formed are exposed (FIG. 2B). The patterning layer 18 may comprise any suitable masking material, such as polymethylmethylacrylate (PMMA). The procedure of Kong et al., "Synthesis of Individual Single-walled Carbon Nanotubes on Patterned Silicon Wafers," *Nature*, 395, 878–881 (October 1998), incorporated herein by reference, maybe employed to grow the nanotubes. According to Kong et al., PMMA is patterned on silicon, and nanotube growth-nucleating material is deposited as a solution. After vaporization of residual solvent, the PMMA is removed and the resulting "catalytic islands" are subjected to chemical vapor deposition (CVD) conditions for nanotube growth.

The nanotubes 22, preferably but not necessarily carbon nanotubes, may be formed, e.g., by plasma state methods or CVD. For example, in CVD atoms of the nucleation layer 16 that are exposed to the vapor act to form the nanotubes by attaching themselves to a growing edge of the tube beneath a catalyst cap 28 (FIG. 2C) The nanotubes 22 will grow substantially vertically, i.e., substantially orthogonal to the substrate 12 (FIG. 2C). Further, the nanotubes 22 will grow only where the nucleation layer 16 is exposed. The nanotubes 22 form hollow tubes having a wall thickness of from about 0.6 nm to about 3 nm and an internal diameter of from about 0.6 nm to about>5 nm. As the nanotubes 22 are formed the exposed portions of the nucleation layer 16 move up with the top portion or upper ends of the nanotubes, forming caps 28 thereon. Patterning layer 18 may then be removed (FIG. 2D).

With reference to FIG. 2E, the caps 28 formed by the portions of the nucleation layer 16 exposed during the nanotube 22 growth may then be removed by etching or other suitable means. The nanotubes 22 are connected to the external circuitry on the substrate 12 by forming conductive rings 40, such as metal rings, about the nanotubes 22 (FIG. 2F). The conductive rings 40 are in direct physical contact with a portion of an outer surface of the nanotubes 22. Undesirable conductive material deposited on the nanotubes 22 during formation of the conductive rings 40 may be removed in any suitable manner as known to those persons skilled in the art. The conductive rings 40 provide necessary electrical connection of the nanotubes 22 to the circuitry (not shown) previously formed on the substrate 12.

With reference to FIG. 2G, a second insulation layer 44 is formed over the nanotube 22 and conductive rings 40. The second insulation layer 44 is formed to protect the nanotube 22 from oxygen in oxidizing environments. The second insulation layer 44 may comprise any insulative material that can be applied below 2800° C. in a vacuum or less than 750° C. in air.

With reference to FIG. 2H, another conducting material is deposited to form a second set of conductive rings 46 about each insulated nanotube 22. Second conductive rings 46 form annular gates (gate 19 in FIG. 1) and comprise any suitable conductive material. The second conductive rings 46 do not directly contact the nanotube 22, but are insulated therefrom by insulation layer 44. With reference to FIG. 2H, a third insulating layer 47 is formed over the second conductive rings 46.

Finally, a follow-on patterning is performed to create the vertical transistor. Specifically, with reference to FIG. 2I, the insulating layer 44 is patterned to expose a portion of nanotube 22 such that a third layer of conductive material may be deposited to form a third set of conductive rings 48. The third conductive rings 48 have direct physical contact with the nanotube 22. The third conductive rings 48 form the drains (drain 21 in FIG. 1) for the vertical nanotube transistors. A third insulation layer 49 is then deposited to protect the vertical transistor from oxygen and other contaminants.

Figure 3:
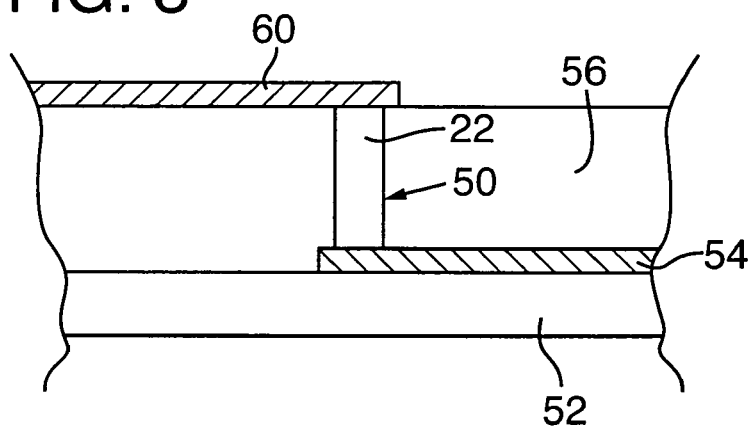
FIG. 3 is an embodiment of a nanotube via for a semiconductor device, e.g., a memory cell device.

Another embodiment of the nanotube semiconductor device of the present invention comprises vertical vias for electrical interconnections between layers of integrated circuits. Specifically, with reference to FIG. 3, an embodiment of a via 50 according to the present invention may comprise a first plane or substrate 52, whereupon desired circuitry (not shown) has been formed. A first trace layer 54 covers a portion of substrate 52. A nanotube 22 (e.g., a carbon nanotube) is connected to the first trace layer 54 and is substantially orthogonal to the first plane 52. A second trace layer 60 covers an upper portion of the nanotube 22 and extends therefrom. The nanotube 22 thus forms a via 50 or electrical interconnection between the first and second trace layers 54 and 60. With reference to FIG. 3, the material 56 between the trace layers 54, 60 may comprise any suitable insulation material described above in relation to other embodiments or known to those skilled in the art. Material 56 essentially comprises the layers of an integrated circuit through which the vias are being formed. In addition to the embodiment shown in FIG. 3, the nanotube vias may be arrayed parallel to the substrate to provide an electrical interconnection of the desired consistent resistance.

The via devices of the present invention provide the same advantages over conventional semiconductor devices as those discussed above in relation to the vertical transistor/capacitor cell device. Specifically, the nanotube vias provide connections having consistent resistance values and may be much smaller than conventional vias or interconnection devices. The individual vias of the present invention offer predictable resistance, governed by quantum mechanics, of about 6 kohm independent of length. Similarly, arrays of nanotube vias provide a means of predictably varying the resistance between a given pair of trace layers.

Figure 4A:
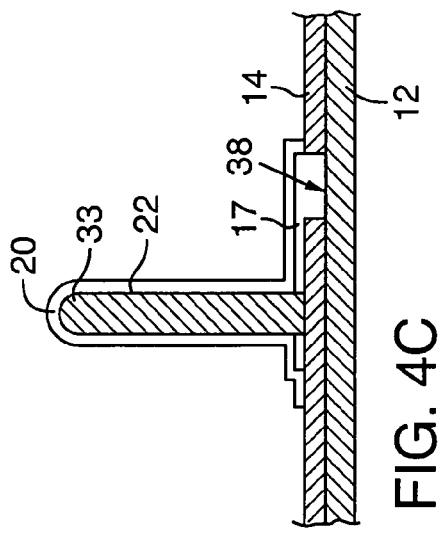
FIGS. 4A–4F depict the process steps for fabrication of an embodiment of a nanotube memory cell capacitor with a control transistor.
Figure 4B:
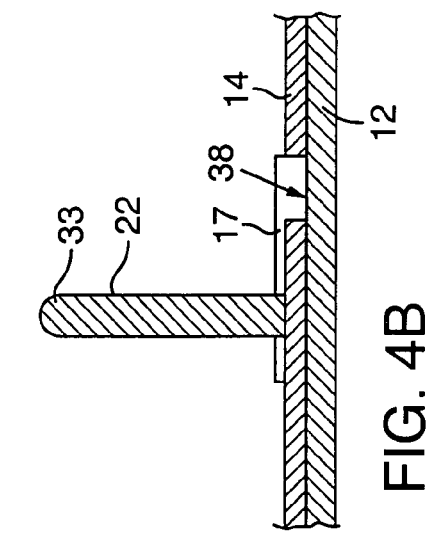
Figure 4C:
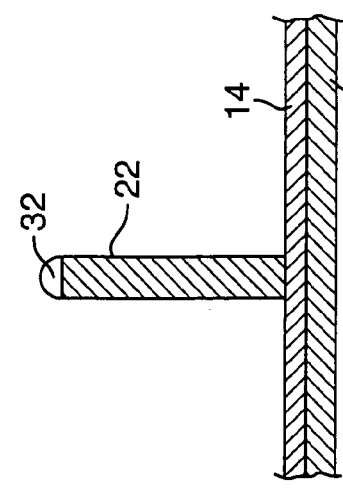
Figure 4D:
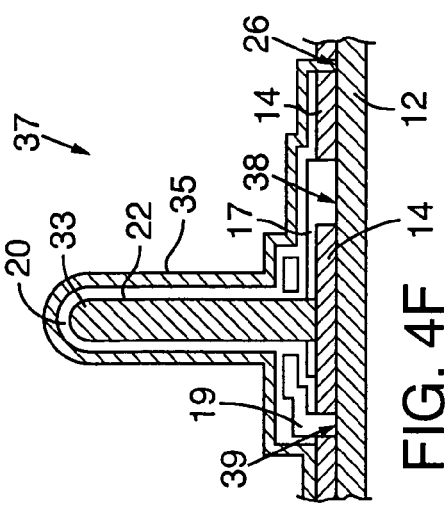
Figure 4E:
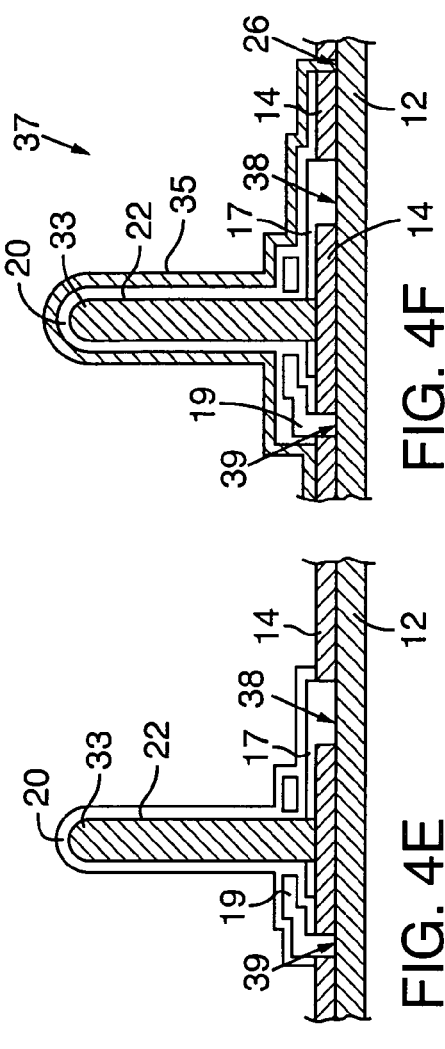
Figure 4F:
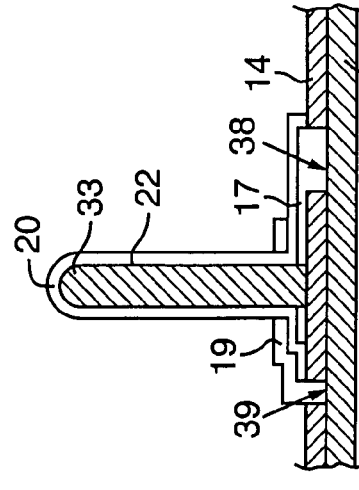

With reference to FIG. 4F, an embodiment of the present semiconductor device may comprise a memory cell capacitor device 37. The device 37 preferably comprises a substrate 12 having therein the desired circuitry (not shown), an insulation layer 14, and a nanotube 22, e.g., a carbon nanotube. In this particular embodiment the nanotube comprises a carbon nanotube having a hemispherical carbon cap 33. Nanotube 22 is connected to source 17, and thereby electrically connected to the external circuitry of the substrate 12 at exposed portion 38 (having external circuitry). An annular gate 19 is electrically connected to the substrate 12 at connection 39. A ground cell plate 35 is provided and is electrically connected to the substrate 12 at connection 26 (an opening through insulation layer 14). Isolation material 20 insulates the source 17, gate 19 and ground cell plate 35.

With reference to FIG. 4F, the source 17 allows the nanotube 22 to receive a potential. The nanotube 22 forms a capacitor cell and may be used as a dielectric. The annular gate 19 controls the effective cross section of the nanotube capacitor cell 22. The effective cross section may be reduced to zero by applying the appropriate potential at annular gate 19. A charge may thus be formed and maintained on the memory cell capacitor device 37 across the nanotube 22 between the source 17 and ground cell plate 35.

With reference to FIGS. 4A–4F, a memory cell capacitor device 37 with a control transistor including a source 17 and gate 19 may be constructed using, e.g., the following process steps. A substrate 12 having the desired circuitry (not shown) and an insulation layer 14 are provided. A nanotube 22 is provided by, e.g., the method set forth above in relation to the transistor/capacitor cell device array as shown in FIG. 2I. Following the formation of the nanotubes 22, a catalyst cap 32 remains at a growing edge of the nanotube 22 (FIG. 4A). The catalyst cap 32 may, optionally, be removed and the nanotube 22 left open. Alternatively, the nanotube 22 may be resubjected to suitable nanotube growth conditions, such as those described above with reference to FIG. 2C, to form the hemispherical carbon cap 33 on the nanotube as shown in FIG. 4B.

The insulation layer 14 is patterned in a manner as known to those skilled in the art to expose a portion 38 of the substrate 12. The source 17 is formed between the nanotube 22 and the substrate 12 at exposed at 38 as depicted in FIG. 4B (such that the source 17 is connected to external circuitry exposed on the substrate). With reference to FIG. 4C, an isolation layer 20 comprising, for example, boron nitride or other suitable insulating material is formed.

A portion 39 of the substrate 12 may then be exposed by a patterning procedure as known to those skilled in the art, and an annular gate 19 formed to encircle nanotube 22 (FIG. 4D). An additional isolation layer 20 is then deposited (FIG. 4E) to insulate the annular gate 19. The additional isolation layer 20 may be deposited over a sublayer of isolation material. The additional isolation layer 20 may comprise any suitable insulating material described in relation to other embodiments above or known to those skilled in the art. The insulation layer 14 is patterned as known to those skilled in the art to expose ground cell plate connection 26 on substrate 12, and ground cell plate 35 comprising aluminum, copper or other conductive material is formed (FIG. 4F).

Figure 5:
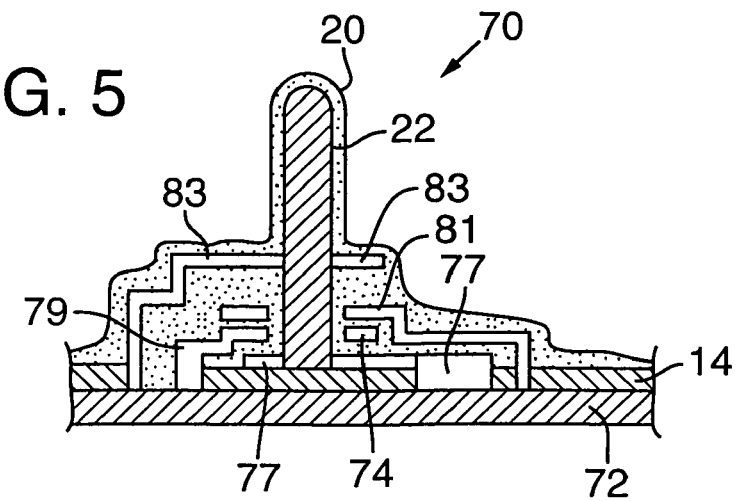
FIG. 5 is an embodiment of a nanotube logic stack for a semiconductor device, e.g., a memory cell device.

Another embodiment of the nanotube semiconductor device of the present invention comprises a logic stack 70 (or multi-gate stack), such as used in an AND gate, as shown in FIG. 5. Such a logic stack 70 may include a substrate 72 comprising any suitable material (as discussed above) that may serve to form substrates for semiconductor devices and a first insulating layer 14 comprising any suitable material (as discussed above). The substrate 72 is treated to form desired circuitry (not shown), to which the final device, the logic stack structure 70 (as shown in FIG. 5) will be connected.

With reference to FIG. 5, the logic stack device 70 comprises two transistors in series formed using a single nanotube 22. Source 77 and two annular gates 79 and 81 are formed about a common nanotube 22. A drain 83 connects the nanotube to the substrate 12. The source 77 may be formed as described above for the memory cell capacitor (FIG. 4B). As shown in FIG. 5, the nanotube 22 is ringed by the two separate insulated gates 79 and 81. Connection of the drain 83 and insulating layer 20 completes the logic stack 70.

The logic stack device 70 may function in similar fashion as a conventional AND gate. The gates control the flow of current through the nanotube 22 (acting as the channel for the transistors) between source 77 and drain 83.

Whereas the invention has been described with reference to multiple embodiments and representative methods, it will be understood that the invention is not limited to those specific embodiments and methods. On the contrary, the invention is intended to encompass all modifications, alternatives, and equivalents as may be included within the spirit and scope of the invention as defined by the appended claims.

What is claimed is:

1. A method of making a semiconductor device comprising:
   providing a substrate;
   forming a first insulation layer on the substrate;
   forming a nucleation layer on the first insulation layer;
   patterning the nucleation layer to cover the nucleation layer such that portions of the nucleation layer remain exposed;
   forming nanotubes on the exposed portions of the nucleation layer, the nanotubes oriented to be substantially vertical in relation to the substrate;
   forming an insulative layer over exterior walls of the nanotubes;
   forming rings of conductive material about the exterior walls of the nanotubes; and
   forming a second insulation layer over the exterior walls of the nanotube.

2. A method of making an electrical interconnect in a semiconductor device comprising:
   providing a substrate having a first trace layer;
   forming a nucleation layer on the substrate;
   patterning the nucleation layer such that a portion of the nucleation layer remains exposed;
   forming a nanotube on the exposed portion of the nucleation layer, the nanotube having a lower end connected to the first trace layer;
   forming an oxide layer over exterior walls of the nanotube and over the nucleation layer;
   patterning the oxide layer to expose an upper end of the nanotube; and
   forming a second trace layer such that the upper end of the nanotube is connected thereto.

3. The method of claim 1, wherein:
   the substrate is patterned with traces of an electrical circuit; and
   the nucleation layer is patterned so as to achieve connection of the semiconductor device with at least one trace of the electrical circuit.

4. The method of claim 1, wherein the nanotubes are formed as carbon nanotubes.

5. The method of claim 1, wherein the semiconductor device is made so as to comprise at least one transistor including at least a respective one of said nanotubes and at least one of the rings of conductive material formed about the exterior wall of the respective nanotube.

6. The method of claim 1, wherein the semiconductor device is made so as to comprise at least one capacitor including at least a respective one of said nanotubes.

7. The method of claim 1, wherein the semiconductor device is made so as to comprise at least one memory cell including at least a respective one of said nanotubes.

8. The method of claim 7, wherein the memory cell is made so as to include:
   a vertical transistor including a gate, a source, a drain, and a channel formed by at least a portion of the respective nanotube; and
   a capacitor.

9. The method of claim 8, wherein the capacitor is made so as to include a cell defined by at least a portion of the respective nanotube.

10. The method of claim 9, wherein the capacitor is made so as to include a ground cell plate formed on the respective nanotube.

11. The method of claim 8, wherein the capacitor is made so as to include a ground plate, an insulator, and a charge plate defined by at least a portion of the respective nanotube.

12. The method of claim 8, wherein:
   the capacitor is mode so as to include, on an exterior wall of the respective nanotube, a ground cell plate; and
   at least a portion of the respective nanotube defines a cell of the capacitor.

13. The method of claim 8, wherein the vertical transistor is formed such that:
the transistor includes a source and a drain formed on the substrate;
at least one of the conductive rings defines a gate of the transistor, and
the respective nanotube defines a channel of the transistor.

14. The method of claim 1, wherein the semiconductor device is made so as to comprise at least one via including at least a respective one of said nanotubes.

15. The method of claim 1, wherein the semiconductor device is made such that at least some of the nanotubes form respective portions of respective circuit elements selected from the group consisting of transistors, capacitors, memory cells, and vias, and combinations thereof.

16. The method of claim 1, wherein:
the semiconductor device is made such that at least one of the nanotubes forms a respective portion of a transistor; and
at least one of the rings formed about the respective nanotube is configured as a gate, source, or drain of the transistor.

17. The method of claim 16, wherein the semiconductor device is made such that at least two of the rings are configured as respective gates of multiple transistors of which the respective nanotube is a portion.

18. The method of claim 1, wherein:
at least one of the nanotubes forms a respective portion of a logic gate; and
at least one of the rings formed about the respective nanotube is configured as an input or output of the logic gate.

19. The method of claim 1, wherein at least one of the nanotubes is formed so as to be a respective portion of a memory cell comprising a transistor and a capacitor.

20. The method of claim 1, further comprising forming, with respect to at least one of the nanotubes, a second set of rings of conductive material about the second insulation layer on the nanotube.

21. The method of claim 20, further comprising:
patterning the second insulation layer to expose a portion of the at least one nanotube; and
forming a third set of rings of conductive material about the nanotube.

22. The method of claim 2, wherein the nanotube is formed as a carbon nanotube.

23. The method of claim 2, wherein the nanotube is formed so as to be substantially orthogonal to the substrate.

24. The method of claim 2, wherein the nanotube is formed substantially parallel to the substrate.

25. The method of claim 2, wherein forming the oxide layer includes forming at least one layer of an integrated circuit of which the semiconductor device is a part.

26. The method of claim 25, wherein the layer of the integrated circuit is connected to the nanotube.

27. The method of claim 25, wherein the nanotube is formed so as to define a via extending from the first trace layer through the integrated-circuit layer to the second trace layer.

* * * * *

UNITED STATES PATENT AND TRADEMARK OFFICE
CERTIFICATE OF CORRECTION

PATENT NO. : 7,081,385 B2 Page 1 of 1
APPLICATION NO. : 10/822113
DATED : July 25, 2006
INVENTOR(S) : Warren M. Farnworth and Kevin G. Duesman It is certified that error appears in the above-identified patent and that said Letters Patent is hereby corrected as shown below:

Col. 8, line 64 (claim 12, line 2), change "mode" to -- made --.

Signed and Sealed this

Seventh Day of November, 2006

JON W. DUDAS
*Director of the United States Patent and Trademark Office*